(12) United States Patent
Eisenberg et al.

(10) Patent No.: US 6,581,196 B2
(45) Date of Patent: Jun. 17, 2003

(54) AUTOMATED CROSSTALK IDENTIFICATION SYSTEM

(75) Inventors: Alan S. Eisenberg, Tempe, AZ (US); Damon M. Cecil, Chandler, AZ (US); Sherman Vadim, Scottsdale, AZ (US); Zhen Xue, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 09/984,817

(22) Filed: Oct. 31, 2001

(65) Prior Publication Data

US 2003/0084412 A1 May 1, 2003

(51) Int. Cl.⁷ ............................................. G06F 17/50
(52) U.S. Cl. .................................... 716/5; 716/4; 716/1
(58) Field of Search .................................. 716/4, 1, 5

(56) References Cited

U.S. PATENT DOCUMENTS

| 6,028,989 | A | * | 2/2000 | Dansky et al. | ................ | 716/8 |
| 6,110,222 | A | * | 8/2000 | Minami et al. | ................ | 716/9 |
| 6,374,391 | B1 | * | 4/2002 | Yamada | ........................ | 716/5 |

* cited by examiner

*Primary Examiner*—Vuthe Siek
*Assistant Examiner*—Brandon Bowers
(74) *Attorney, Agent, or Firm*—Kenyon & Kenyon

(57) ABSTRACT

A computer implemented method and system of identifying crosstalk in a circuit provides significant benefits over conventional manual approaches. The method provides for selecting a plurality of signals from computer aided design (CAD) data based on a step of electro-magnetic interference (EMI) criteria. Trace-to-trace run length values of traces corresponding to the signals are measured in accordance with a trace spacing. The method further provides for indication which traces have one length values above a predetermined threshold.

15 Claims, 6 Drawing Sheets

AUTOMATED CROSSTALK IDENTIFICATION SYSTEM

BACKGROUND OF THE INVENTION

1 Technical Field

The present invention generally relates to the identification of crosstalk in electrical circuits. More particularly, the invention relates to a system and method of identifying crosstalk that involves automatically determining trace-to-trace run length values for the circuit.

2 Discussion

In the semiconductor industry increased functionality, faster performance and lower operating voltages have placed a new set of demands on the packages serving as an interface between integrated.circuits (ICs) and printed wiring boards (PWBs). For example, higher signaling rates have been shown to increase unwanted electromagnetic emissions in ICs, PWBs and semiconductor packages. Furthermore, regulatory organizations such as the Federal Communications Commission (FCC) have restricted electromagnetic interference (EMI) emissions to levels that have forced semiconductor suppliers, systems companies and manufacturing foundries to address the issue of EMI in order to maintain viability in such a competitive industry.

"Crosstalk" occurs when current paths through a structure such as a PWB or semiconductor package carry signals that interfere with one another. Thus, crosstalk can occur between signal pins.in a connector, between vias in a substrate, between traces in a PWB, and in numerous other scenarios.

While a number of approaches have been used to identify crosstalk between traces in a PWB, there remains room for significant improvement. For example, one approach is to test a fully designed and manufactured product under operating conditions for EMI emissions. While this approach is perhaps the most direct, it will be appreciated that in the event that the measured EMI emissions are above the permitted levels, redesign of the trace layout may necessary. It will further be appreciated that such a result may be quite costly and therefore has significant practical limitations.

Another approach is to produce a hard copy of the trace design, and to manually measure trace-to-trace run length values. This approach relies on the widely accepted understanding that when traces run along side each other at a given spacing for greater than a predetermined distance, the likelihood for EMI emissions increases (particularly in the case of high frequency signals such as clock signals). The difficulty with the manual approach, however, is that it is relatively labor intensive and can therefore be cost prohibitive.

Yet another approach is to use a commercially available computer aided design (CAD) tool to manipulate the traces of the circuit in order to determine trace-to-trace run length values. Under this approach, a first trace is selected using a graphical interface, and the segments of the selected trace are copied to a distance equal to the predetermined trace spacing in order to simulate the region that other traces should avoid in order to minimize crosstalk. Thus, the user may determine run length values by selecting trace segments falling in the simulated region with the CAD tool. This approach requires a significant amount of user manipulation, skill and time in order to select the desired segments and traces, and to calculate the desired values.

BRIEF DESCRIPTION OF THE DRAWINGS

The various advantages of the present invention will become apparent to one skilled in the art by reading the following specification and appended claims, and by referencing the following drawings, in which:

DETAILED DESCRIPTION OF THE PREFERRED EMBODIMENTS

A system and computer implemented method of identifying crosstalk in a circuit in accordance with the present invention provide a number of benefits. The method provides for selecting a plurality of signals from CAD data based on a set of electro-magnetic interference (EMI) criteria. Trace-to-trace run length values of traces corresponding to the signals are measured in accordance with a trace spacing. The method further provides for indicating which traces have run length values above a predetermined threshold.

In another aspect of the invention, a computer implemented method of measuring trace-to-trace run length values is provided. A first trace is selected from a plurality of traces corresponding to a plurality of signals in the circuit. The first trace is converted to a polygon based on the trace spacing. The method further provides for accumulating distance values based on intersections between the polygon and a second trace such that the accumulated distance values define a run length value for the first trace and the second trace.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

Figure 1:
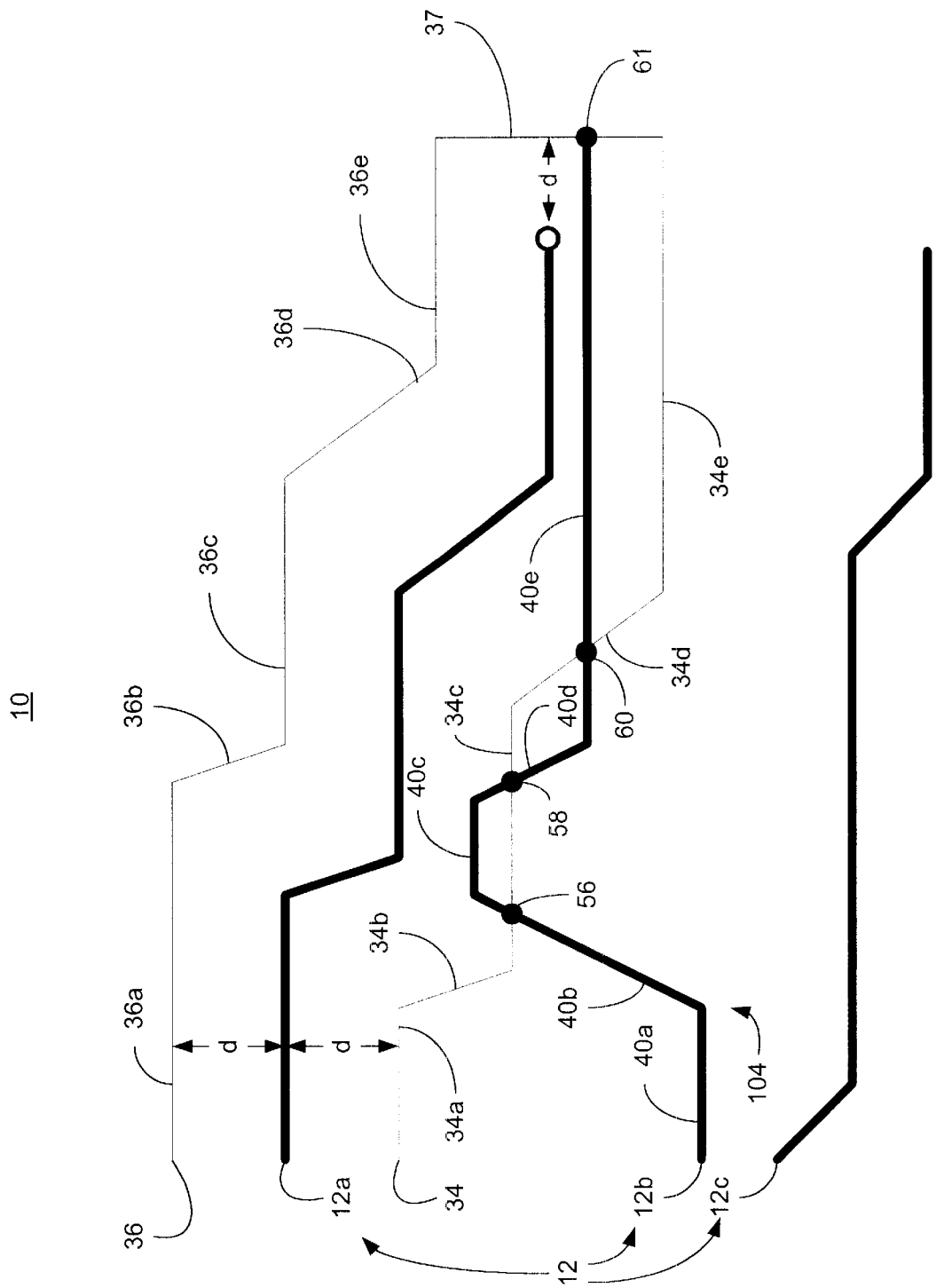
FIG. 1 is a diagram showing an example of a trace layout of an integrated circuit in accordance with one embodiment of the present invention.

FIG. 1 shows a plan view of a trace layout 10 for which the present invention can be used. The trace layout 10 includes a plurality of traces 12 that transport a corresponding plurality of signals to and from an associated integrated circuit (IC). In this regard, it should be noted that the trace layout 10 is not part of the IC itself. Notwithstanding, the trace layout 10 typically has a set of computer aided design (CAD) data associated with it, where the CAD data results from and is used during the design process. A number of CAD software products such as commercially available "Cadence Advanced Package Designer" (APD) can be used to generate, manipulate, and view the CAD data and associated the trace layout 10, although no particular product is required. It should be noted that the trace layout 10 is typically but a small snapshot of a more complex collection of traces that interconnect processors, chip sets and other components in the IC environment. It should also be noted that although the present invention will be primarily described with regard to personal computer (PC) applications the invention is not so limited. In fact, the principles described herein can be readily applied to any environment in which crosstalk is of concern. Notwithstanding, there are a number of aspects of PC applications for which the present invention is uniquely suited.

Figure 2:
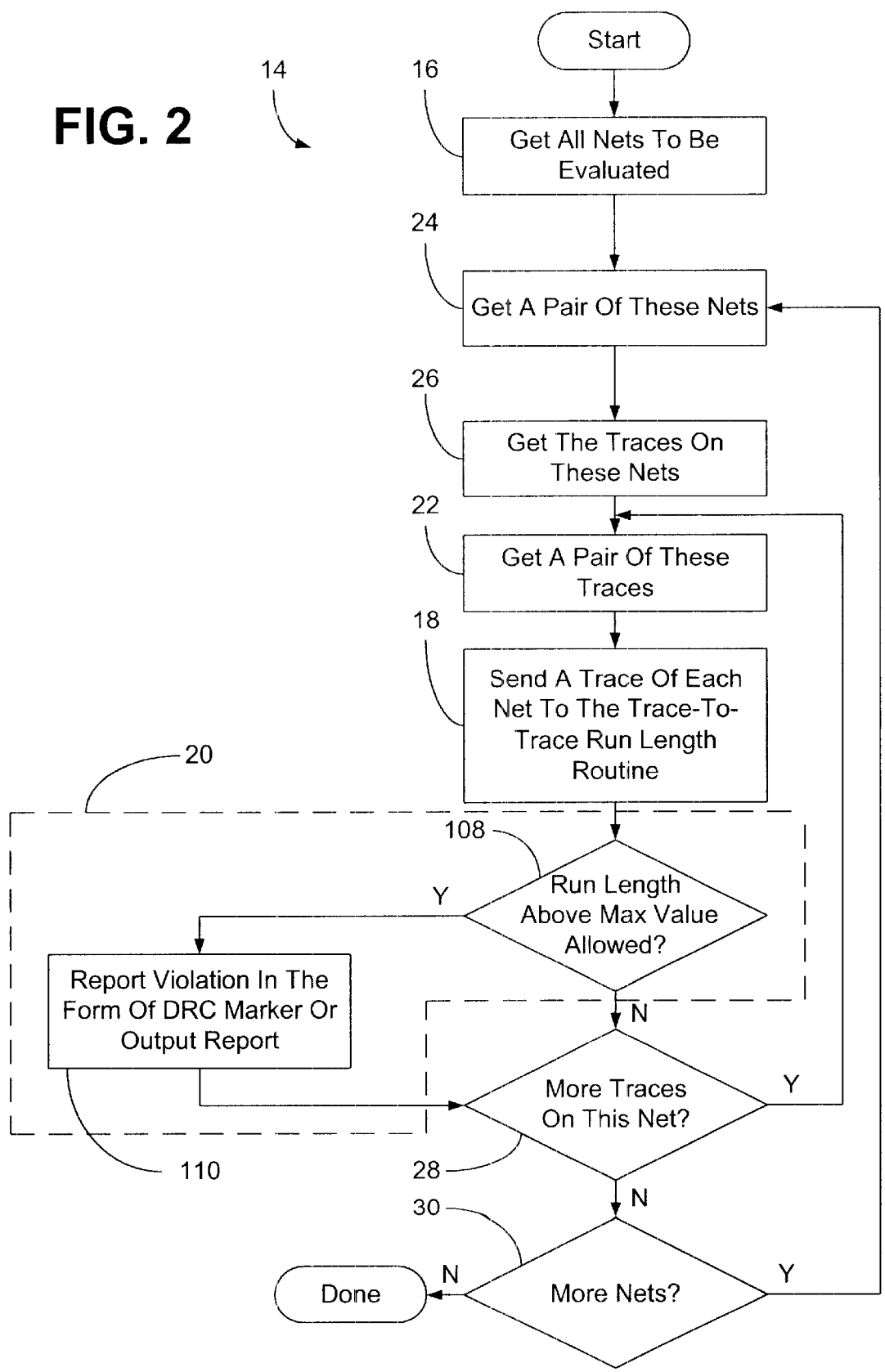
FIG. 2 is a flowchart of an example of a computer implemented method of identifying crosstalk in a circuit in accordance with one embodiment of the present invention.

With continuing reference to FIGS. 1 and 2, it can be seen that the present invention provides a computer implemented method 14 of identifying crosstalk in a circuit. Crosstalk is the term used to refer to unwanted signal coupling between lines. It will be appreciated that crosstalk is a complex function of the characteristics of a "driver" and "receiver", trace characteristics, and switching patterns. Certain generalities, however, regarding package design and its relationship to crosstalk can be made. For example, crosstalk is primarily affected by the distance between traces, the amount of parallelism between traces, and the presence of reference plane discontinuities. The longer the parallel distance between two or more lines, the higher the crosstalk between them. Furthermore, the closer the lines are to one another, the higher the crosstalk.

Generally, the method 14 provides for selecting a plurality of signals (i.e., nets) at processing block 16 from CAD data based on a set of EMI criteria. As already noted, certain signals such as clock signals can be flagged as being signals of interest. Other high speed signals may be also included in the EMI criteria. The method 14 further provides for measuring trace-to-trace run length values at processing block 18. The run length values are for traces corresponding to the signals in accordance with a desired trace spacing. Block 20 provides for indicating which traces have run length values above a predetermined threshold at the desired trace spacing. It is preferred that the software/hardware implementing the method 14 be run from within the CAD tool of choice. In this regard, block 16 involves querying the design database for information and block 20 involves reporting violations to the user in accordance with the CAD tool environment.

More particularly it can be seen that a pair of nets is selected from the plurality of nets at block 24, and the traces on the selected nets are obtained at block 26. Thus, block 22 provides for the selection of a pair of traces, where each trace corresponds to a net. In this regard, it should be noted that each net often has more than one trace. Furthermore, it will be appreciated that the net and trace selection process can be accomplished in a number of ways. For example, one approach is to select the first net, and select a trace from the first net. A rough distance check can then be performed to locate a nearby trace from one of the other nets. The rough distance check can be executed by drawing a bounding box around the selected trace, expanding the box to the desired distance, and identifying all traces falling within the bounding box. All traces not on the list of nets to be evaluated are thrown out, as well as any traces on the selected net (i.e., the first net in this example). The result is a pair of nearby traces where each trace corresponds to a distinct net. It can further be seen that block 28 enables repeating of the trace selection process until all traces on the pair of nets have been traversed. Similarly, block 30 enables repeating of the net selection process illustrated at block 24 until all nets of interest have been traversed.

Figure 3:
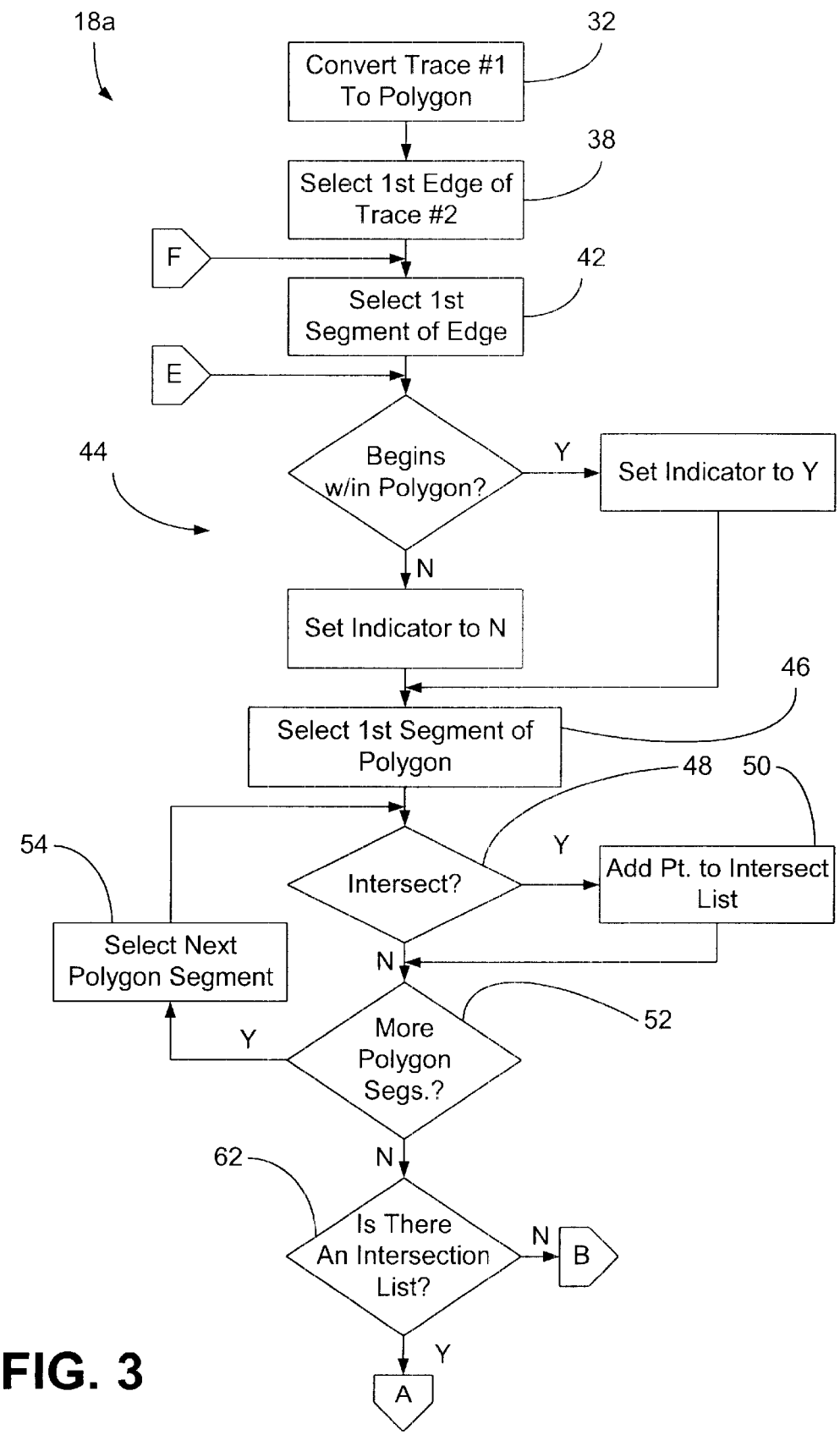
FIGS. 3–5 are flowcharts of an example of a method of measuring trace-to-trace run length values in accordance with one embodiment with the present invention.
Figure 4:
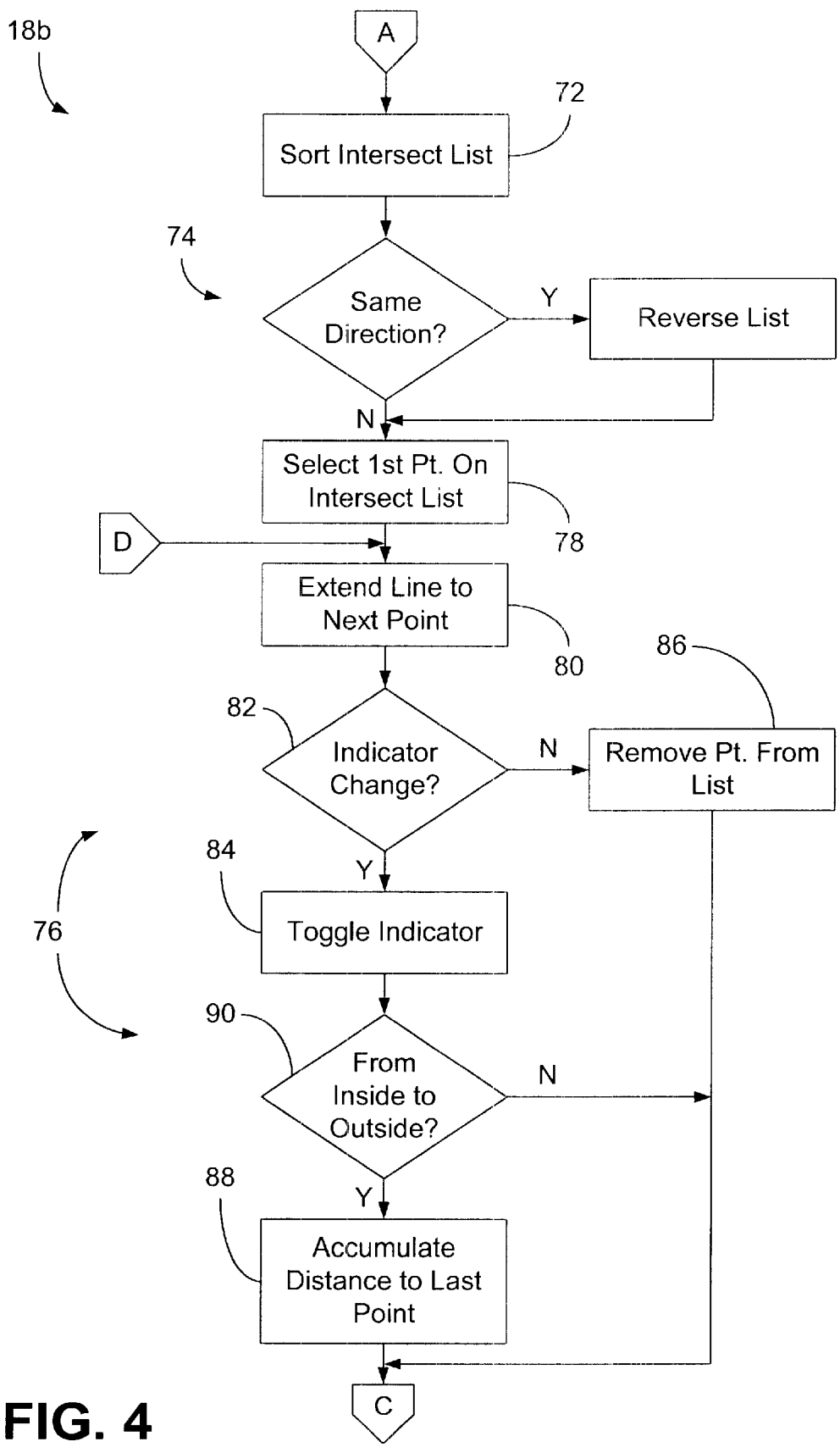
Figure 5:
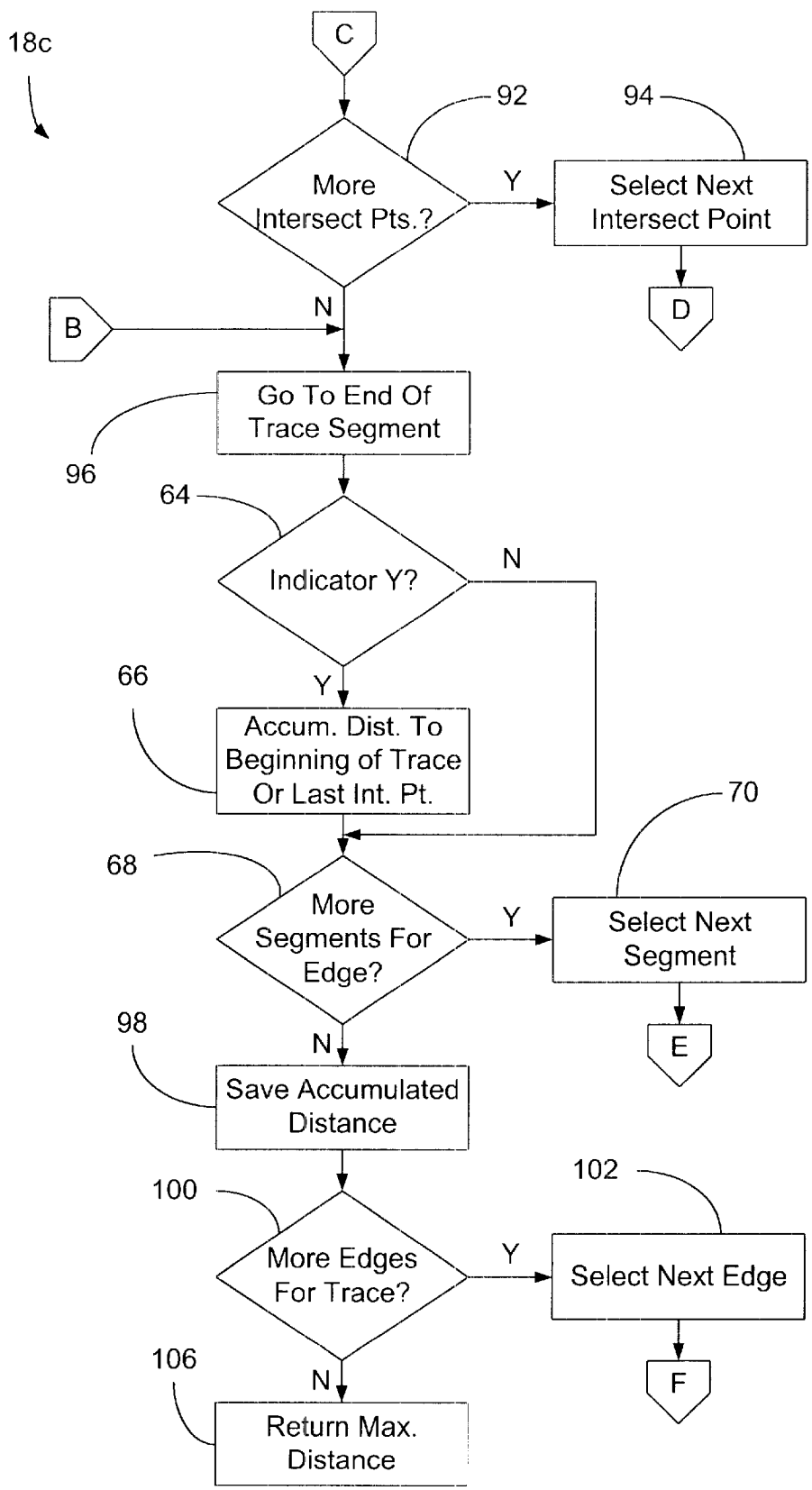

Tuning now to FIGS. 3–5 a first, second and third portion of one approach to measuring trace-to-trace lengths is shown at 18a, 18b, and 18c, respectively. With specific regard to FIG. 3, it can be seen that the first trace in the pair of traces is converted to a polygon at block 32 based the desired trace spacing. This technique is best shown in FIG. 1 for trace 12a. It can be seen that for a given trace spacing "d" a polygon defined by lines 34, 36 and 37 can be obtained to assist in the automated trace measuring process.

It will be appreciated that where trace 12b is the second trace, the portions of the trace falling within the polygon defined by lines 34, 36, and 37 should be used to calculate the run length value for the trace pair 12a, 12b. The computer implemented approach of the present invention iteratively steps through the segments of trace 12b on an edge-by-edge basis. Thus, FIGS. 1 and 3 illustrate that processing block 38 provides for selecting a first edge 40 of the second trace 12b, and block 42 provides for selecting a first segment 40a of the first edge 40. If the first segment 40a begins within the polygon, an indicator is set to "Y" at blocks 44. Otherwise, the indicator is set to "N". It should be noted that the indicator provides a mechanism for keeping track of whether the trace of interest begins inside or outside the polygon.

Once the indicator is set, distance values are accumulated based on intersections between the polygon and the second trace 12b such that the accumulated distance values define a run length value for the first trace 12a and the second trace 12b. Specifically, processing block 46 provides for extracting a perimeter list from the polygon, where the perimeter list contains points defining a perimeter of the polygon. Thus, a first segment 34a of the polygon can be selected as a starting point for the intersection determination process. It can be seen that it is determined whether the polygon first segment 34a intersects the trace first segment 42a at block 48. If there are remaining polygon segments, the intersection point is added to an intersection list at block 50. Otherwise, it is determined whether there are any remaining polygon segments at block 52. If there are remaining polygon segments, the next polygon segment is selected at block 54 and the intersection determination is repeated. Thus, an intersection list can be generated for each trace segment by systematically stepping through polygon segments 34a–34e and 36a–36e. Thus, in the illustrated example trace segment 40a does not intersect any of the polygon segments, and therefore will not result in an intersection list. When this determination is made at block 62, the routine proceeds o the end of the trace segment at block 96 (FIG. 5). A check is made at block 64 to determine whether the segment began and ended inside the polygon. If so, processing block 66 provides for accumulating the distance to the beginning of the trace segment as part of the run length value measurement.

Turning now to FIGS. 1 and 5, it can be seen that processing block 68 enables a determination of whether there are any remaining segments for the selected edge. If so, the next segment, trace segment 40b, is selected at block 70 and the procedure returns to the processing blocks shown in FIG. 3. It will appreciated that trace segment 40b does not begin within the polygon and will therefore result in an indicator setting of "N".

It will further be appreciated that intersection point 56 will be identified at processing block 48 and added to the intersection list at block 50 when the polygon segment 34c is compared to the trace segment 40b. Thus, the decision at processing block 62 will result in a determination that an intersection list exists, where the list contains only one point. It should be noted that the additional intersection points 58, 60 and 61 will be identified during subsequent passes of the illustrated routine.

Turning now to FIGS. 1 and 4, it can be seen that processing block 72 provides for sorting the intersection list in either the X (horizontal) or Y (vertical) direction. The original trace is compared with the sorted list in order to have the points traverse in the same direction as the trace at processing blocks 74. Thus, the list maybe reversed in order to obtain the desired result. It will further be appreciated that generally at blocks 76 the intersection points are confirmed for the selected trace segment. Specifically, processing block 78 provides for selecting the first point on the intersection list, namely, intersection point 56 in the illustrated example. A line is extended from point 56 to the next point on the intersection list (or to the end of the segment) at processing block 80. If it is determined that extending the line causes an indicator change at block 82, the indicator is toggled at block 84 to maintain the correct in or out of polygon status. If the line does not cause a change in the indicator, the intersection point is not valid and is removed at processing block 86. An example of an invalid intersection point would be the trace segment lying directly on top of the polygon perimeter. In such case, the trace edge would not fall inside the predetermined trace spacing and, although being a borderline case, would not satisfy the underlining EMI criteria.

It can further be seen that if the trace segment transitions from inside to outside the polygon, the distance to the last intersection point should be accumulated at block 68. On the other hand, if it is determined at block 90 that the segment transitions from outside to inside the polygon, as in the case of trace segment 40b, the accumulation block is bypassed.

Returning now to FIGS. 1 and 5, it can be seen that processing block 92 provides for determining whether more intersection points are present. If so, the next intersection point is selected at block 94 and the process returns to the line extension portion shown in FIG. 4. Otherwise, FIG. 5 illustrates that processing block 96 provides for traversal to the end of the trace segment. If the indicator is set to "Y", the distance to either the beginning of the trace or the last intersection point is accumulated at block 66. On the other hand, if processing block 64 determines that the segment ends outside the polygon, the accumulation block is bypassed.

It can further be seen that a determination is made at processing block 68 of whether there are any remaining segments for the selected edge. If not, the accumulated distance is saved at processing block 98, and a search for remaining edges is made at processing block 100. Thus, block 102 provides for selecting a second edge 104 for the second trace 12b. The above described process steps are therefore repeated for the second edge 104, and the maximum accumulated distance for the two edges is, returned at block 106.

Returning now to FIG. 2, it can be seen that processing block 108 provides for a determination of whether the returned run length value exceeds the maximum allowed value. It can further be seen that processing block 110 provides for reporting violations either in the form of design rule check (DRC) markers or an output report. The DRC markers preferably enable the trace pairs having an excessive run length for the given spacing to be highlighted or otherwise distinguished from the other traces. Such visual indication can be very useful when dealing with the complex trace layouts often encountered in modem day designs. It will further be appreciated that by enabling direct access to the CAD data, the violations can be reported within the confines of the desired CAD tool.

Figure 6:
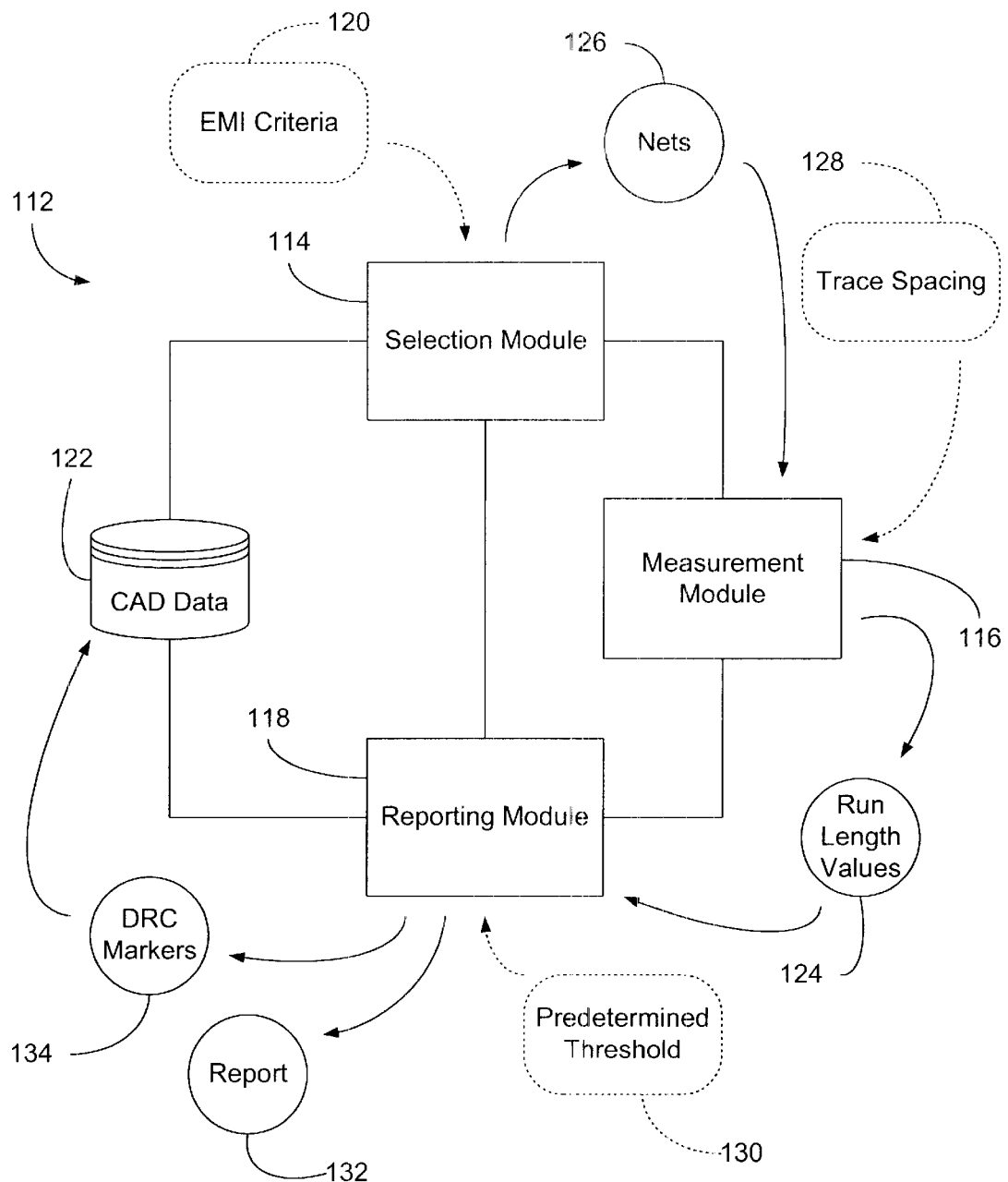
FIG. 6 is a block diagram of an example of an automated crosstalk identification system in accordance with one embodiment of the present invention.

FIG. 6 shows a crosstalk identification system 112 capable of executing the above described processing blocks. The identification system 112 can be implemented using any number of readily available hardware and/or software programming techniques. It will further be appreciated that the identification system 112 can be embodied in any type of computer-readable storage medium capable of storing a set of instructions, where the instructions are capable of being executed by a processor to measure trace-to-trace run length values. Generally, the identification system 112 has a selection module 114, a measurement module 116 and a reporting module 118. The selection module 114 selects a plurality of nets 126 from CAD data based on a set of electromagnetic interference criteria 120. The CAD data preferably resides in a database 122 that is maintained by a commercially available design tool in which the identification system is incorporated. The measurement module 116 is operatively coupled to the selection module 114, and measures trace-to-trace run length values 124 of traces corresponding to the nets 126 in accordance with a trace spacing 128. The reporting module 118 indicates which traces have run length values above a predetermined threshold 130. It can be seen that the reporting module 118 may generate a report 132 of the traces having run length values 124 above the predetermined threshold 130. The reporting module 118 can also add DRC markers to the CAD data resident in the database 122. The DRC markers 134 indicate which traces have run length values 124 above the predetermined threshold 130.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A computer implemented method of measuring trace-to-trace run length values in a circuit, the method comprising:

selecting a first trace from a plurality of traces corresponding to a plurality of nets in the circuit;

converting the first trace to a polygon based on the trace spacing; and accumulating distance values based on intersections between the polygon and a second trace such that the accumulating distance values define a run length value for the first trace and the second trace.

2. The method of claim 1 further including repeating the trace selection, trace conversion and distance value accumulation for each trace in the plurality of traces.

3. The method of claim 1 further including:

selecting a first trace edge of the second trace;

extracting a perimeter list from the polygon, the perimeter list containing points defining a perimeter of the polygon; and generating an intersection list, the intersection list containing intersection points between the polygon and the first edge of the second trace.

4. The method of claim 3 further including repeating the edge selection, perimeter list extraction and intersection list generation for a second trace edge corresponding to the second trace.

5. The method of claim 3 further including:

selecting a first trace segment of the first edge;

confirming the intersection points for the first trace segment; and calculating difference values between confirmed intersection points such that the difference values define a run length value for the first trace segment.

6. The method of claim 5 further including:

repeating the trace segment selection, intersection point confirmation and difference value calculation for a plurality of trace segments corresponding to the first edge such that a plurality of difference values result;

a summing the plurality of difference values; and storing the summed difference values to a computer readable storage medium.

7. A computer implemented method of identifying crosstalk in a circuit, the method comprising:

selecting a plurality of nets from computer aided design (CAD) data based on a set of electro-magnetic interference (EMI) criteria;.

selecting a first trace from traces corresponding to a plurality of nets of the circuit;

converting the first trace to a polygon based on a trace space;

accumulating distance values based on intersections between the polygon and a second trace such that the accumulated distance values define a run length value for the first trace and the second trace;

repeating the trace selection, trace conversion and distance value accumulation for each trace corresponding to the plurality of nets; and adding design rule check (DRC) markers to the CAD data, where the DRC markers indicate which traces have run length values a predetermined threshold.

8. The method of claim 7 further including:

selecting a first edge of the second trace;

extracting a perimeter list from the polygon, the perimeter list containing points defining a perimeter of the polygon; and generating an intersection list, the intersection list containing intersection points between the polygon and the first edge of the second trace.

9. The method of claim 8 further including repeating the edge selection, perimeter list extraction and intersection list generation for a plurality of edges corresponding to the second trace.

10. A computer-readable storage, medium storing a set of instructions, the set of instructions capable of being executed by a processor to measure trace-to-trace run length values, the method comprising:

selecting a first trace from a plurality of traces corresponding to a plurality of nets in the circuit;

converting the first trace to a polygon based on the trace spacing; and accumulating distance values based on intersections between the polygon and a second trace such that the accumulated distance values define a run length value for the first trace and the second trace.

11. The medium of claim 10 wherein the method further includes repeating the trace selection, trace conversion and distance value accumulation for each trace in the plurality of traces.

12. The medium of claim 10 wherein the method further includes:

selecting a first trace edge of the second trace;

extracting a perimeter list from the polygon, the perimeter list containing points defining a perimeter of the polygon; and generating an intersection list, the intersection list containing intersection points between the polygon and the first edge of the second trace.

13. The medium of claim 12 wherein the method further includes repeating the edge selection perimeter list extraction and intersection list generation for a second trace edge corresponding to the second trace.

14. The medium of claim 12 wherein the method further includes:

selecting a first trace segment of the first edge;

confirming the intersection points for the first trace segment; and calculating difference values between confirmed intersection points such that the difference values define a run length value for the first trace segment.

15. The medium of claim 14 wherein the method further includes:

repeating the trace segment selection, intersection point confirmation and difference value calculation for a plurality of trace segments corresponding to the first edge such that a plurality of difference values result;

summing the plurality of difference values; and storing the summed difference values to a computer readable storage medium.

* * * * *

UNITED STATES PATENT AND TRADEMARK OFFICE
CERTIFICATE OF CORRECTION

PATENT NO. : 6,581,196 B2
DATED : June 17, 2003
INVENTOR(S) : Alan S. Eisenberg et al.

It is certified that error appears in the above-identified patent and that said Letters Patent is hereby corrected as shown below:

Column 1,
Line 16, "integrated. circuits" should be -- integrated circuits --

Column 5,
Line 23, "at block 68" should be -- at block 88. --
Line 26, "block is" should be -- block 88 is --
Line 59, "modem day" should be -- modern day --

Signed and Sealed this

Seventeenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,581,196 B2
DATED : June 17, 2003
INVENTOR(S) : Alan S. Eisenberg et al.

It is certified that error appears in the above-identified patent and that said Letters Patent is hereby corrected as shown below:

<u>Title page</u>,
Item [75], Inventors, should read as follows:
-- Alan S. Eisenberg, Tempe, AZ (US);
Damon M. Cecil, Chandler, AZ (US);
Vadim Sherman, Scottsdale, AZ (US);
Zhen Xue, Santa Clara, CA (US). --

<u>Column 1</u>,
Line 16, "integrated. circuits" should be -- integrated circuits --

<u>Column 5</u>,
Line 23, "at block 68" shoul be -- at block 88. --
Line 26, "block is" should be -- block 88 is --
Line 59, "modem day" should be -- modern day --

Signed and Sealed this

Ninth Day of November, 2004

JON W. DUDAS
*Director of the United States Patent and Trademark Office*